United States Patent
Lee et al.

(10) Patent No.: US 11,594,421 B2
(45) Date of Patent: *Feb. 28, 2023

(54) SUBSTRATE TREATING APPARATUS AND SUBSTRATE TREATING METHOD

(71) Applicant: SEMES CO., LTD., Chungcheongnam-do (KR)

(72) Inventors: Youngil Lee, Cheonan-si (KR); Jungbong Choi, Suwon-si (KR); Seungho Lee, Cheonan-si (KR); Gui Su Park, Asan-si (KR); Gil Hun Song, Cheonan-si (KR); Seung Hoon Oh, Cheonan-si (KR); Jonghan Kim, Asan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/030,514

(22) Filed: Sep. 24, 2020

(65) Prior Publication Data

US 2021/0013047 A1 Jan. 14, 2021

Related U.S. Application Data

(63) Continuation of application No. 16/158,728, filed on Oct. 12, 2018, now abandoned.

(30) Foreign Application Priority Data

Oct. 12, 2017 (KR) ........................ 10-2017-0132079

(51) Int. Cl.
*H01L 21/311* (2006.01)
*H01L 21/67* (2006.01)
(Continued)

(52) U.S. Cl.
CPC .. *H01L 21/31111* (2013.01); *H01L 21/02052* (2013.01); *H01L 21/30604* (2013.01);
(Continued)

(58) Field of Classification Search
None
See application file for complete search history.

(56) References Cited

U.S. PATENT DOCUMENTS 8,038,796 B2 * 10/2011 Ricci .................. H01L 21/6833
118/724
8,235,001 B2 * 8/2012 Sano .................. C23C 16/4408
118/695

(Continued)

FOREIGN PATENT DOCUMENTS

JP 2016-054170 A 4/2016
JP 2016-192550 A 11/2016
(Continued)

OTHER PUBLICATIONS

Office Action for related Korean Patent Application No. 10-2019-0104267, dated Oct. 1, 2019 (6 pages).
(Continued)

*Primary Examiner* — Sylvia Macarthur
(74) *Attorney, Agent, or Firm* — Procopio, Cory, Hargreaves & Savitch LLP

(57) ABSTRACT

A substrate treating apparatus and a substrate treating method are provided. The substrate treating apparatus includes a support member to support a substrate, a treatment liquid nozzle to supply a treatment liquid to the substrate positioned on the support member, and a controller to control the treatment liquid nozzle such that the treatment liquid supplied to the substrate is differently discharged in a low-flow-supply section and a high-flow-supply section in which an average discharge amount per hour is more than an
(Continued)

average discharge amount per hour in the low-flow-supply section.

15 Claims, 8 Drawing Sheets

(51) Int. Cl.
*H01L 21/02* (2006.01)
*H01L 21/306* (2006.01)
*H01L 21/687* (2006.01)

(52) U.S. Cl.
CPC .... *H01L 21/6715* (2013.01); *H01L 21/67051* (2013.01); *H01L 21/67063* (2013.01); *H01L 21/67109* (2013.01); *H01L 21/67115* (2013.01); *H01L 21/67248* (2013.01); *H01L 21/67253* (2013.01); *H01L 21/6875* (2013.01)

(56) References Cited

U.S. PATENT DOCUMENTS

| | | | | |
|---|---|---|---|---|
| 9,748,118 | B2* | 8/2017 | Kim | H01L 21/67051 |
| 9,852,933 | B2* | 12/2017 | Ito | H01L 21/30604 |
| 10,450,653 | B2* | 10/2019 | Chen | H01J 37/32183 |
| 10,682,674 | B2* | 6/2020 | Jung | H01L 21/67103 |
| 10,964,557 | B2* | 3/2021 | Kim | H01L 21/6715 |
| 2012/0187083 | A1* | 7/2012 | Hashizume | B05C 11/00 |
| | | | | 216/37 |
| 2013/0256267 | A1* | 10/2013 | Ota | B05C 9/14 |
| | | | | 156/345.24 |
| 2013/0333722 | A1* | 12/2013 | Tanaka | B08B 3/10 |
| | | | | 134/1 |
| 2015/0090694 | A1* | 4/2015 | Hashimoto | H01L 21/67751 |
| | | | | 134/33 |
| 2016/0021702 | A1* | 1/2016 | Jang | H05B 1/0233 |
| | | | | 134/18 |
| 2017/0287769 | A1* | 10/2017 | Ota | H01L 21/67109 |
| 2021/0013047 | A1* | 1/2021 | Lee | H01L 21/67253 |

FOREIGN PATENT DOCUMENTS

| | | |
|---|---|---|
| KR | 10-2015-0029565 A | 3/2015 |
| KR | 10-2015-0070354 A | 6/2015 |
| KR | 10-2015-0124968 A | 11/2015 |
| KR | 10-2015-0015346 A | 2/2016 |
| KR | 10-2016-0064101 A | 6/2016 |
| KR | 10-1743101 B | 6/2017 |
| KR | 10-2017-0100431 A | 9/2017 |
| KR | 10-2019-0041079 A | 4/2019 |

OTHER PUBLICATIONS

Office Action for related Korean Patent Application No. 10-2019-0104267, dated Apr. 21, 2020 (6 pages).
Notice of Allowance for related Korean Patent Application No. 10-2019-0104267, dated Sep. 10, 2020 (6 pages).
Office Action for related Korean Patent Application No. 10-2020-0083915, dated Jun. 28, 2021 (7 pages).

* cited by examiner

SUBSTRATE TREATING APPARATUS AND SUBSTRATE TREATING METHOD

CROSS-REFERENCE TO RELATED APPLICATIONS

This application is a Continuation of U.S. patent application Ser. No. 16/158,728, filed on Oct. 12, 2018, which claims priority under 35 U.S.C. § 119 to Korean Patent Application No. 10-2017-0132079 filed on Oct. 12, 2017, in the Korean Intellectual Property Office, the disclosures of which are incorporated by reference herein in their entireties.

BACKGROUND

Embodiments of the inventive concept described herein relate to a substrate treating apparatus and a substrate treating method.

To fabricate a semiconductor device and a liquid crystal display panel, various processes, such as photolithography, etching, ashing, ion implanting, thin film deposition, and cleaning processes have been performed. Among them, the etching process, which is to remove an unnecessary region from a thin film formed on a substrate, requires a higher selective ratio and a higher etching rate with respect to the thin film. In addition, during the above processes, a process of performing heat treatment the substrate may be performed.

In general, the etching process or the cleaning process is mainly performed by sequentially performing a chemical treatment step, a rinse treatment step, and a dry treatment step. According the chemical treatment step, the thin film formed on the substrate is etched or chemicals are supplied to the substrate to remove foreign matters from the substrate. According to the rinse treatment step, a rinse liquid, which is pure water, is supplied onto the substrate. When the substrate is treated by using a fluid, the substrate may be heated.

SUMMARY

Embodiments of the inventive concept provide a substrate treating apparatus and a substrate treating method, capable of efficiently treating the substrate.

According to an exemplary embodiment, there can be provided a substrate treating apparatus including a support member to support a substrate, a treatment liquid nozzle to supply a treatment liquid to the substrate positioned on the support member, and a controller to control the treatment liquid nozzle such that the treatment liquid supplied to the substrate is differently discharged in a low-flow-supply section and a high-flow-supply section in which an average discharge amount per hour is more than an average discharge amount per hour in the low-flow-supply section.

In addition, the controller may control the treatment liquid nozzle to stop discharging the treatment liquid in the low-flow-supply section.

Further, the substrate treating apparatus may further include a heating member to heat the substrate positioned on the support member.

In addition, the controller may control the heating member such that a heating temperature of the heating member in the high-flow-supply section is lower than a heating temperature of the heating member in the low-flow-supply section.

Further, the heating member may is provided as a lamp mounted on the support member.

Further, the heating member may be a resistance-heating type of hot wire positioned in the support member.

In addition, the heating member may be a laser source to irradiate a laser to the support member.

In addition, the heating member may irradiate the laser in a form of a line beam throughout a region between a rotation center of the substrate and an outer end portion of the substrate.

Further, the treatment liquid may be phosphoric acid.

Further, the support member may be rotatably provided, and the controller may control the support member such that a rotation speed of the support member in the high-flow-supply section is higher than a rotation speed of the support member in the low-flow supply section According to an exemplary embodiment, there may be provided a substrate treating method comprising treating a substrate by supplying a treatment liquid to the substrate, and the treatment liquid may be differently supplied to the substrate in a low-flow-supply section and a high-flow-supply section in which an average discharge amount per hour is more than an average discharge amount per hour in the low-flow-supply section.

In addition, the average discharge amount per hour in the low-flow-supply section may be equal to or less than half of the average discharge amount per hour in the high-low-supply section.

Further, discharging the treatment liquid to the substrate may be stopped in the low-flow-supply section.

In addition, the substrate may be heated at a higher temperature in the low-flow-supply section, rather than the high-flow-supply section.

Further, the substrate may be rotated at a higher speed in the high-flow-supply section, rather than the low-flow-supply section.

In addition, the treatment liquid may be phosphoric acid.

BRIEF DESCRIPTION OF THE FIGURES

The above and other objects and features of the inventive concept will become apparent by describing in detail exemplary embodiments thereof with reference to the accompanying drawings.

DETAILED DESCRIPTION

Figure 1:
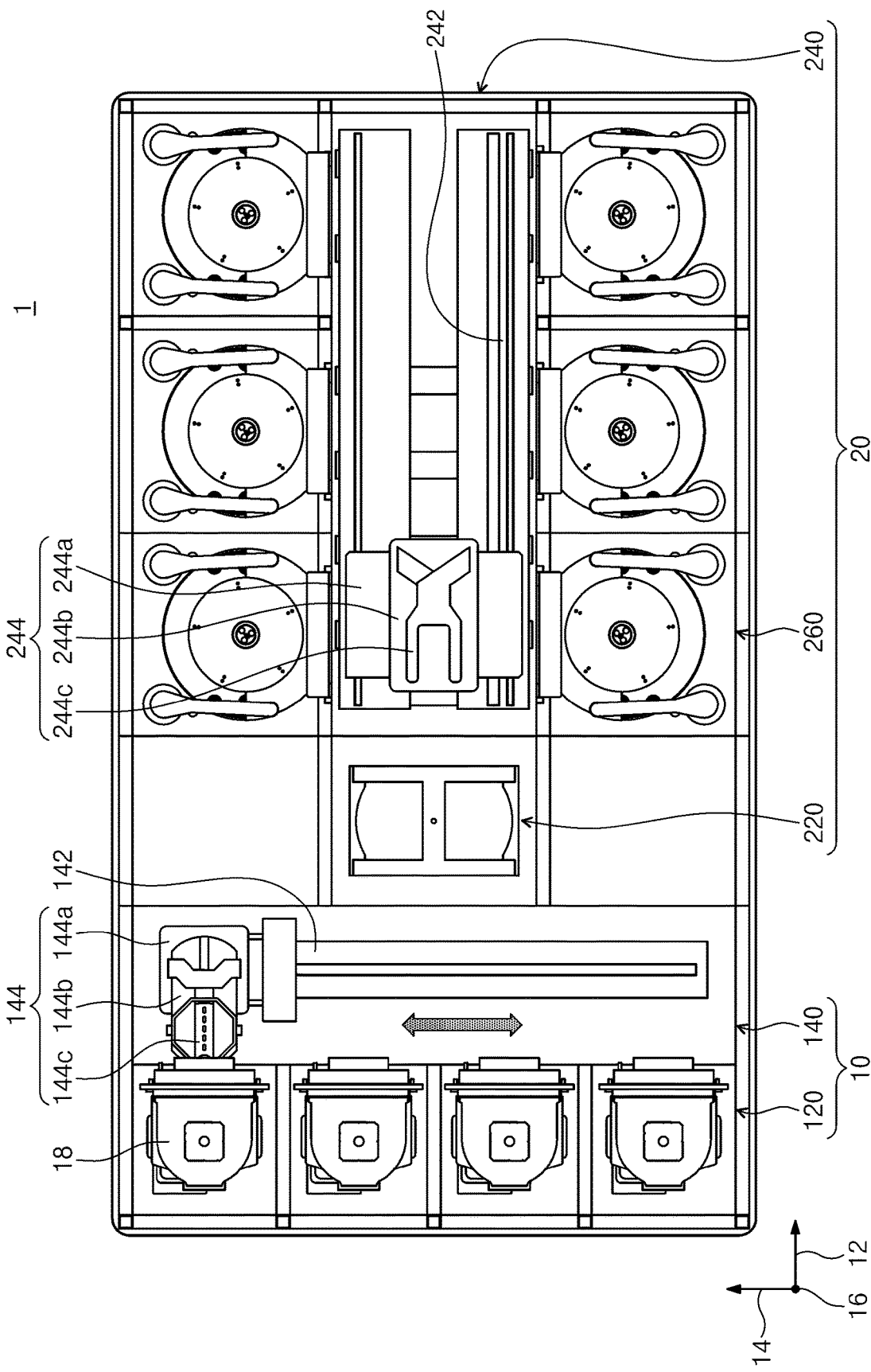
FIG. 1 is a plan view illustrating a substrate treating apparatus, according to an embodiment of the inventive concept.

Hereinafter, an embodiment of the inventive concept will be described in more detail with reference to the accompanying drawings. The embodiments of the inventive concept may be modified in various forms, and the scope of the inventive concept should not be construed to be limited by the embodiments of the inventive concept described in the following. The embodiments of the inventive concept are provided to describe the inventive concept for those skilled in the art more completely. Accordingly, the shapes and the like of the components in the drawings are exaggerated to emphasize clearer descriptions.

FIG. 1 is a plan view illustrating a substrate treating apparatus, according to an embodiment of the inventive concept.

Referring to FIG. 1, a substrate treating apparatus 1 may have an index module 10 and a process treating module 20. The index module 100 may contain a load port 120 and a feeding frame 140. The load port 120, the feeding frame 140, and the process treating module 20 may be sequentially arranged in a row. Hereinafter, a direction in which the load port 120, the feeding frame 140, and the process treating module 20 are arranged will be referred to as a first direction 12, a direction that is perpendicular to the first direction 12 when viewed from the top will be referred to as a second direction 14, and a direction that is normal to a plane containing the first direction 12 and the second direction 14 will be referred to as a third direction 16.

A carrier 18 having a substrate W received therein is seated on the load port 120. A plurality of load ports 120 are provided, and are arranged in the second direction 14 in a line. The number of the load ports 120 may increase or decrease depending on the process efficiency of the process treating module 20 or a footprint. The carrier 18 has a plurality of slots (not illustrated) to receive the substrates "W" arranged horizontally to the ground surface. A front opening unified pod (FOUP) may be used as the carrier 18.

The process treating module 20 includes a buffer unit 220, a feeding chamber 240, and a process chamber 260. The feeding chamber 240 is disposed such that the lengthwise direction thereof is in parallel to the first direction 12. Process chambers 260 are arranged at opposite sides of the feeding chamber 240. The process chambers 260 may be arranged at one side and the other side of the feeding chamber 240 so as to be arranged symmetrically to each other about the feeding chamber 240. The plurality of process chambers 260 may be provided at one side of the feeding chamber 240. Some of the process chambers 260 are arranged in the lengthwise direction of the feeding chamber 240. Furthermore, others of the process chambers 260 are arranged to be stacked on each other. That is, the process chambers 260 may be arranged in an A-by-B matrix at the one side of the feeding chamber 240. In this case, A is the number of the process chambers 260 aligned in a line in the first direction 12, and B is the number of the process chambers 260 aligned in a line in the third direction 16. When four or six process chambers 260 are provided at one side of the feeding chamber 240, the process chambers 260 may be arranged in 2×2 or 3×2. The number of the process chambers 260 may increase or decrease. Unlikely, the process chambers 260 may be provided only at any one side of the feeding chamber 240. In addition, a process chamber 260 may be provided in a single layer at one side and opposite sides of the feeding chamber 240.

The buffer unit 220 is interposed between a feeding frame 140 and the feeding chamber 240. The buffer unit 220 provides a space in which the substrate W stays before the substrate is carried between the feeding chamber 240 and the feeding frame 140. A slot(s) (not illustrated) that a substrate W is placed may be provided in the buffer unit 220. A plurality of slots (not illustrated) may be provided to be spaced apart from each other in the third direction 16. The buffer unit 220 is open in surfaces facing the feeding frame 140 and the feeding chamber 240.

The feeding frame 140 carries the substrate "W" between a carrier 18 seated in the load port 120 and the buffer unit 220. The feeding frame 140 includes an index rail 142 and an index robot 144. The index rail 142 is provided such that the lengthwise direction thereof is in parallel to the second direction 14. The index robot 144 is installed on the index rail 142 to move in the second direction 14 along the index rail 142. The index robot 144 may contain a base 144a, a body 144b, and an index arm 144c. The base 144a may be installed to be movable along the index rail 142. The body 144b may be joined to the base 144a. The body 144b may be provided to be movable on the base 144a in the third direction 16. Furthermore, the body 144b may be provided to be rotatable on the base 144a. The index arm 144c may be joined to the body 144b such that the index arm 144c is movable forward and backward with respect to the body 144b. A plurality of index arms 144c may be provided, and may be driven independently from each other. The index arms 144c may be arranged to be stacked on each other while being spaced apart from each other in the third direction 16. Some of the index arms 144c are used when carrying the substrates "W" to the carrier 18 from the process treating module 20, and other of the index arms 144c may be used when carrying the substrates W from the carrier 18 to the process treating module 20. This structure may prevent particles, which are produced from the substrates "W" before the process treatment, from sticking to the substrates "W" after the process treatment in the process that the index robot 144 introduces and withdraws the substrates "W" into and out.

The feeding chamber 240 carries the substrate W between any two of the buffer unit 220 and the process chamber 260, and between the process chambers 260. The feeding chamber 240 includes a guide rail 242 and an index robot 244. The guide rail 242 is disposed such that the lengthwise direction thereof is parallel to the first direction 12. The main robot 244 is installed on the guide rail 242 to linearly move in the first direction 12 on the guide rail 242. The main robot 244 may contain a base 244a, a body 244b, and a main arm 244c. The base 244a may be installed to be movable along the guide rail 242. The body 244b may be joined to the base 244a. The body 244b may be provided to be movable on the base 244a in the third direction 16. Furthermore, the body 244b may be provided to be rotatable on the base 244a. The main arm 244c may be joined to the body 244b such that the main arm 244c is movable forward and backward with respect to the body 244b. A plurality of main arms 244c may be provided, and may be driven independently from each other. The main arms 244c may be arranged to be stacked on each other while being spaced apart from each other in the third direction 16.

The process chamber 260 may perform a process treatment with respect to the substrate W. Although all processes performed in the process chamber 260 are the same, at least two different processes may be performed.

Figure 2:
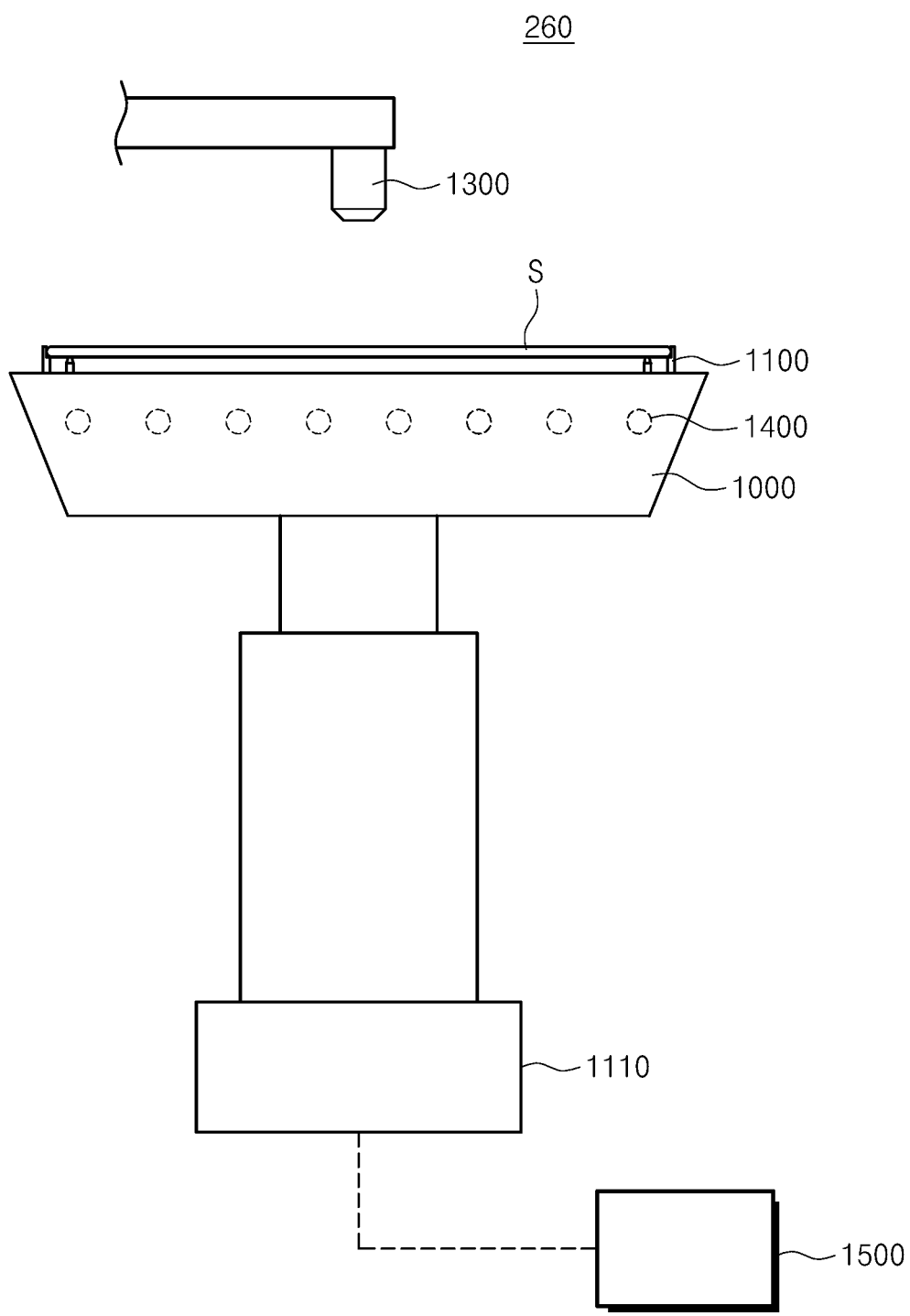
FIG. 2 is a view illustrating a process chamber, according to an embodiment of the inventive concept.

FIG. 2 is a view illustrating a process chamber, according to an embodiment of the inventive concept.

Referring to FIG. 2, the process chamber 260 includes a support member 1000, a treatment liquid nozzle 1300, a heating member 1400, and a controller 1500.

The support member 1000 supports a substrate S during the process. The support member 1000 is provided such that the top surface of the support member 1000 has a preset area. For example, the support member 1000 has an area wider than an area of the substrate S, and supports the substrate S by using a pin 1100 provided on the top surface thereof. Accordingly, the substrate S may be supported in the state that the bottom surface of the substrate S may be spaced apart from the top surface of the support member 1000. In addition, the support member 1000 may be provided to fix the substrate S in a manner of vacuum-sucking the substrate S in the state that the top surface of the support member 1000 has an area wider or narrower than the area of the substrate S. The support member 1000 may be provided to be rotatable by power applied by the driver 1110 and may rotate the substrate S during the process.

The treatment liquid nozzle 1300 discharges a treatment liquid toward the substrate S placed on the support member 1000 to treat the substrate S. The treatment liquid may include phosphoric acid. In addition, the treatment liquid may be chemicals such as sulfuric acid ($H_2SO_4$), nitric acid ($HNO_3$), ammonia ($NH_3$) and the like.

The heating member 1400 heats the substrate S during the process. For example, the heating member 1400 may be provided in the form positioned inside the support member 1000.

Figure 3:
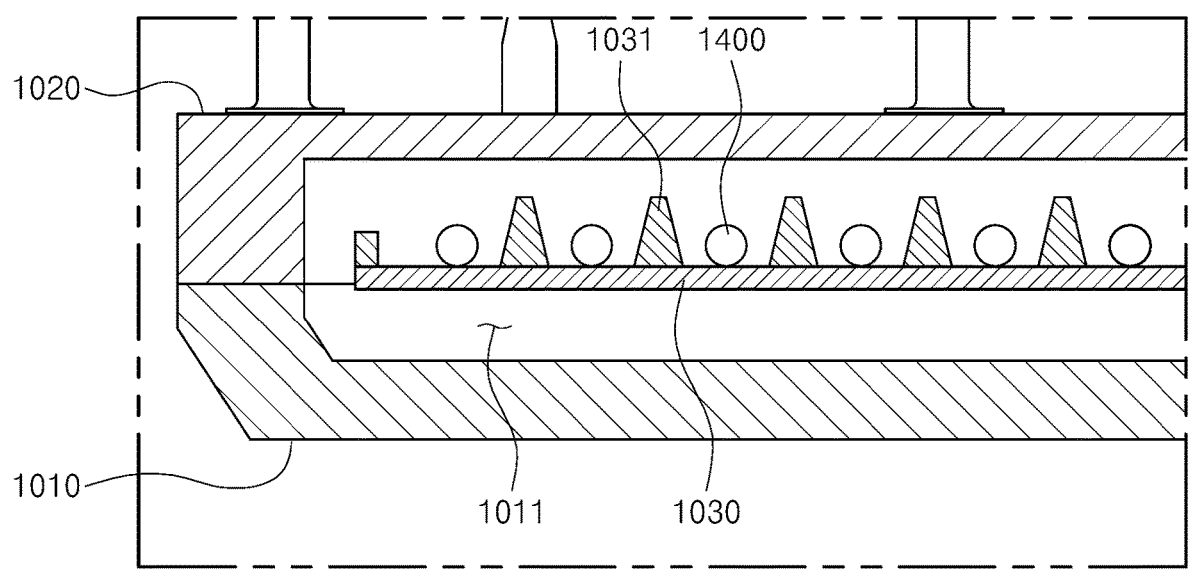
FIG. 3 is a partial sectional view illustrating a support member, according to an embodiment of the inventive concept.

FIG. 3 is a partial sectional view illustrating the support member, according to an embodiment.

Referring to FIG. 3, the support member 1000 includes a chuck stage 1010 and the heating member 1400.

The chuck stage 1010 provides an upper structure of the support member 1000. A receiving space 1011 is formed inside the chuck stage 1010. An upper portion of the receiving space 1011 may be shielded by a transmissive plate 1020. The transmissive plate 1020 may have higher transmittance for energy supplied by the heating member 1400. For example, the transmissive plate 1020 may include a quartz material.

The heating member 1400 may be provided inside the chuck stage 1010. The heating member 1400 may be a lamp or a resistance-heating type of a hot wire. The heating member 1400 may be provided in a ring shape. A plurality of heating members 1400 may have different radiuses from the rotational center of the chuck stage 1010. The plurality of heating members 1400 may be individually controlled in terms of intensity of light irradiated from the heating members 1400 or heat emitted from the heating members 1400.

The heating member 1400 may be provided in the form positioned on the support plate 1030. For example, the support plate 1030 may be positioned in the receiving space 1011 of the chuck stage 1010 and the heating member 1400 may be provided in the form supported by the support plate 1030. The support plate 1030 may assist the heating member 1400 such that the heating member 1400 emits light or heat toward the upper portion of the chuck stage 1010. For example, the top surface of the support plate 1030 may be formed of a metallic material. A passage for cooling the heating member 1400 is provided in a form that is spaced from the inner surface of the chuck stage 1010 above or below the support plate 1030. For example, the passage for cooling the heating member 1400 may be provided in the receiving space 1011.

A partition 1031 may be provided in the heating members 1400. When a plurality of heating members 1400 are provided, the partition 1031 may be interposed between adjacent heating members 1400. In addition, the partition 1031 may be formed outside the outermost heating member. The partition 1031 may reduce the influence which is exerted on a region adjacent to a region heated by the heating member 1400 by the heated region. Accordingly, the control efficiency of the region heated by each heating member 1400 may be improved.

Figure 4:
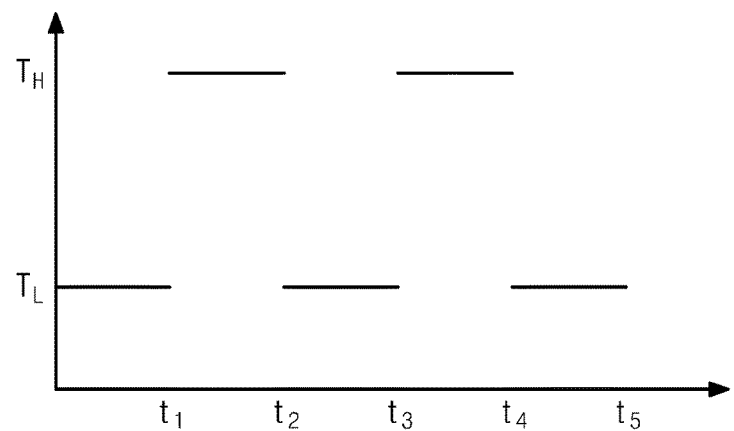
FIG. 4 is a graph illustrating a heating temperature of a heating member.

FIG. 4 is a graph illustrating the heating temperature of the heating member.

With further reference to FIG. 4, the controller 1500 controls components of the process chamber 260. The controller 1500 controls the heating member 1400 to perform a high-temperature heating process and a low-temperature heating process. A high-temperature-heating temperature TH has a set value higher than a set value of a low-temperature-heating temperature TL.

Each of high-temperature-heating sections t1-t2 and t3-t4 appear at least one time after low-temperature-heating sections 0-t1, t2-t3, and t4-t5 or between 0-t1 and t2-t3 and between t3-t3 and t4-t5, respectively. When each of the high-temperature-heating sections t1-t2 and t3-t4 appears at least two times, the high-temperature-heating sections t1-t2 and t3-t4 may have an equal duration or different durations. In addition, the low-temperature-heating sections 0-t1, t2-t3, and t4-t5 may have an equal duration or different durations. Further, the durations of the low-temperature-heating sections 0-t1, t2-t3, and t4-t5 may be equal to or different from the durations of the high-temperature-heating sections t1-t2 and t3-t4. For example, the high-temperature-heating sections t1-t2 and t3-t4 and the low-temperature-heating sections 0-t1, t2-t3, and t4-t5 are started and lasted for 10 seconds. Then, the high-temperature-heating sections t1-t2 and t3-t4 and the low-temperature-heating sections 0-t1, t2-t3, and t4-t5 are alternately maintained by 10 seconds for a preset period of time. For example, the duration that the substrate S is subject to heat treatment by the heating member 1400 may be 1 minute.

Figure 5:
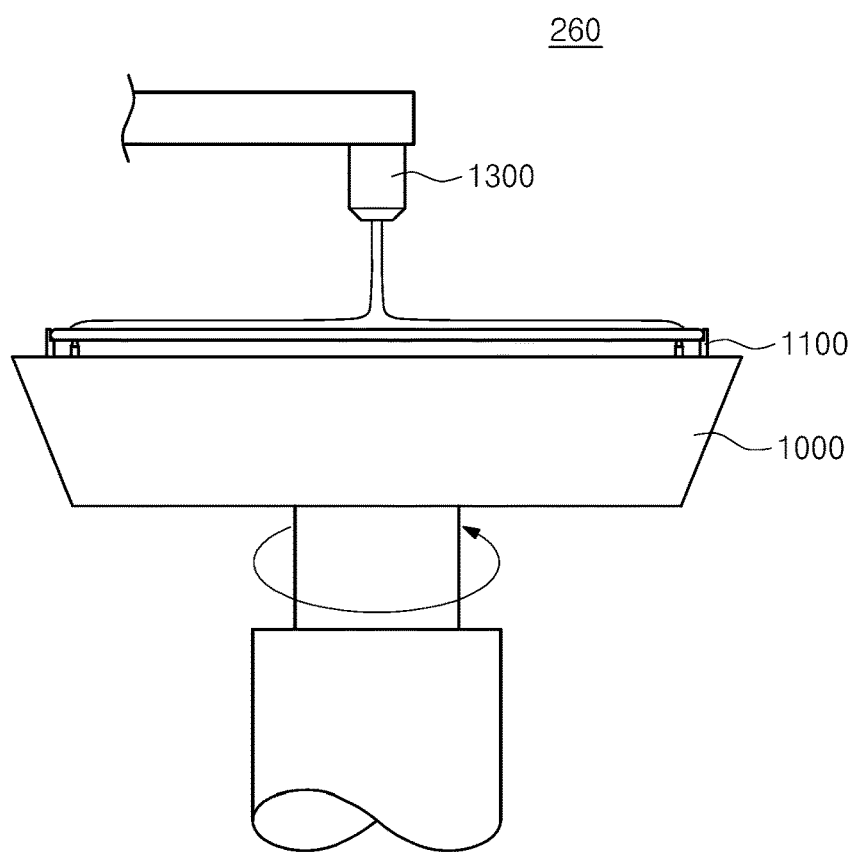
FIGS. 5 and 6 are views illustrating the state of discharging a chemical liquid to the substrate by a treatment liquid nozzle.
Figure 6:
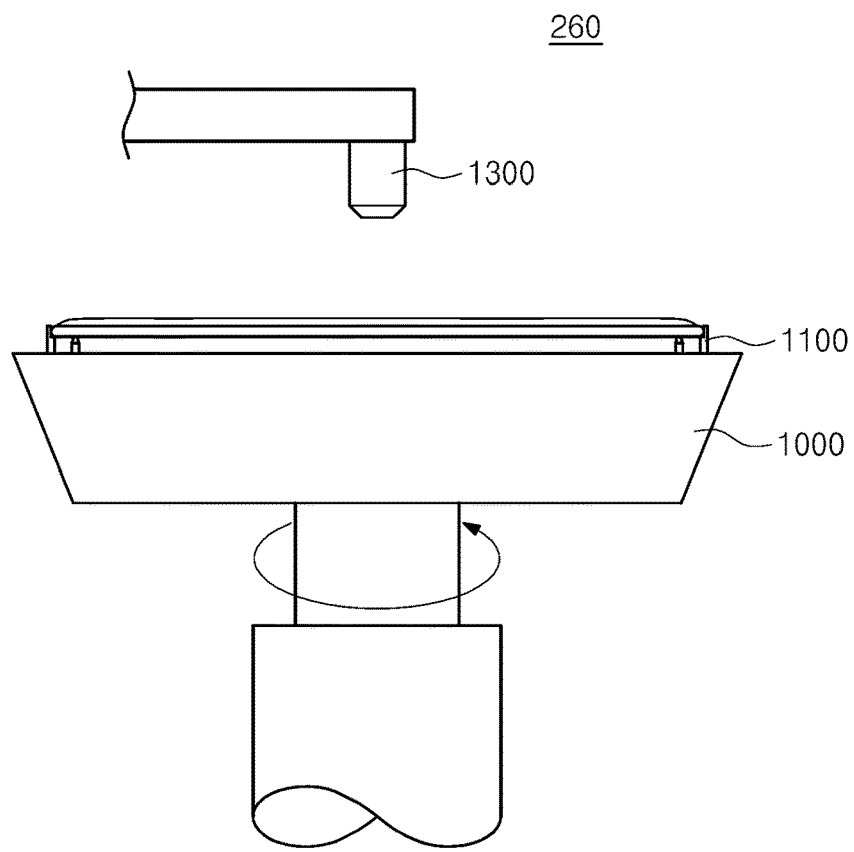

FIGS. 5 and 6 are views illustrating the state of discharging a chemical liquid to the substrate by the treatment liquid nozzle.

Referring to FIGS. 5 and 6, the controller 1500 controls the treatment liquid nozzle 1300 to supply various amounts of treatment liquid to the substrate S depending on times.

The controller 1500 controls the treatment liquid nozzle 1300 to discharge the treatment liquid to the substrate S, based on whether a flow section is a high-flow-supply section or a low-flow-supply section. An average amount of discharged treatment liquid per time in the low-flow-supply section is less than an average amount of discharged treatment liquid per time in the high-flow-supply section. The average amount of discharged treatment liquid in the low-flow-supply section is made to be ½ less than the average amount of discharged treatment liquid in the high-flow-supply section. For example, the controller 1500 may control the treatment liquid nozzle 1300 such that discharging the chemical liquid is stopped in the low-flow-supply section.

The low-flow-supply section is overlapped with the high-temperature-heating sections t1-t2 and t2-t4 for more significant time, rather than the low-temperature-heating sections 0-t1, t2-t3, and t4-t5. The high-flow-supply section is overlapped with the low-temperature-heating sections 0-t1, t2-t3, and t4-t5 for more significant time, rather than the high-temperature-heating sections t1-t2 and t3-t4. For example, Low-flow-supply sections may be matched with the high-temperature-heating sections t1-t2 and t3-t4 and high-flow-supply sections may be matched with low-temperature-heating sections 0-t1, t2-t3, and t4-t5.

The degree that the substrate S is treated by the treatment liquid depends on the substrate S and the temperature of the treatment liquid. For example, as the temperatures of the substrate S and the treatment liquid are increased, the treatment rate and the treatment efficiency of the substrate S are increased by phosphoric acid. Meanwhile, the substrate S is rotated while the treatment liquid is being supplied. Accordingly, the treatment liquid, which is heated after being supplied to the substrate S, is scattered out of the substrate S, and a new treatment liquid, which is not heated, is discharged to the substrate S. Accordingly, the heating efficiency by the support member 1000 is degraded.

According to the inventive concept, the substrate treating apparatus forms a low-flow-supply section that the treatment liquid is less supplied, during the treatment process for the substrate S. Accordingly, as an amount of treatment liquid heated with calorie supplied by the heating member 1400 is reduced, the substrate S and the treatment liquid are heated at a higher temperature within a shorter period of time, thereby increasing the reactivity between the treatment liquid and the substrate S. In addition, the time that the low-flow-supply section is overlapped with the high-temperature-heating sections t1-t2 and t3-t4 may be greatly increased and thus the efficiency of heating the substrate S and the treatment liquid may be improved.

The controller 1500 may control the support member 1000 such that the support member 1000 rotates at different rotation speeds in the low-flow-supply section and the high-flow-supply section. The controller 1500 may control the support member 1000 such that the rotational speed of the support member 1000 in the low-flow-supply section is lower than the rotational speed of the support member 1000 in the high-flow-supply section. Therefore, in the case of the treatment liquid supplied to the substrate S in the low-flow-supply section, although the time that the treatment liquid remains on the substrate S is increased and a smaller amount of treatment liquid is supplied to the substrate S, an amount of the treatment liquid remaining on the substrate S may be maintained to be a set amount. In addition, when the treatment for the substrate S is started using the treatment liquid, the controller 1500 controls the treatment liquid nozzle 1300 and the heating member 1400 depending on the high-flow-supply sections and the low-flow-supply sections 0-t1, t2-t3, t4-t5, such that the treatment liquid is supplied to the substrate S as soon as the treatment for the substrate S is started.

Figure 7:
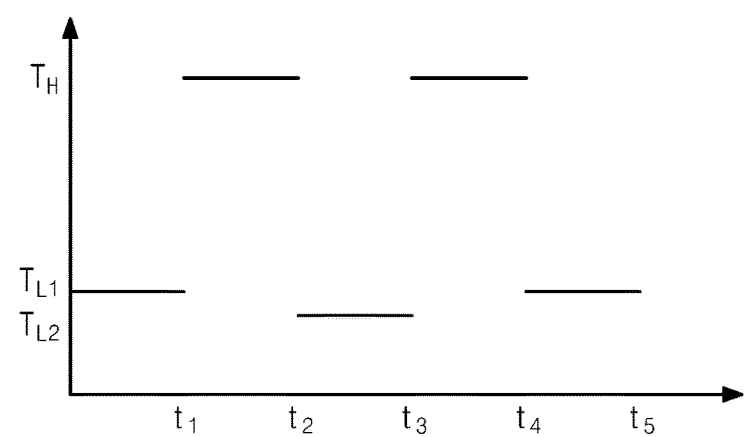
FIG. 7 is a graph illustrating a heating temperature of a heating member, according to another embodiment.

FIG. 7 is a graph illustrating a heating temperature of a heating member, according to another embodiment.

Referring to FIG. 7, at least two heating temperatures may be formed in low-temperature-heating sections 0-t1, t2-t3, and t4-t5. For example, a first low-temperature-heating temperature TL1 may be formed to be higher than a second low-temperature heating temperature TL2. In this case, the difference between the first low-temperature-heating temperature TL1 and the second low-temperature-heating temperature TL2 may be formed to be less than the difference between the first low-temperature-heating temperature TL1 and the high-temperature-heating temperature TH.

The relation between the high-temperature-heating sections t1-t2 and t3-t4 and the low-temperature-heating-sections 0-t1, t2-t3, and t4-t5 and amounts of discharged treatment liquids are the same as those illustrated in FIGS. 6 and 7. Accordingly, the redundant details thereof will be omitted in the following description.

Figure 8:
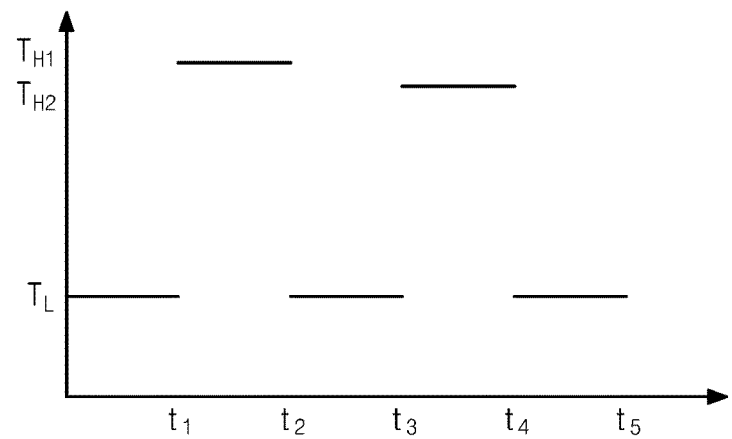
FIG. 8 is a graph illustrating a heating temperature of a heating member, according to still another embodiment.

FIG. 8 is a graph illustrating a heating temperature of the heating member, according to still another embodiment.

Referring to FIG. 8, at least two heating temperatures may be formed in high-temperature-heating sections t1-t2 and t3-t4. For example, a first low-temperature-heating temperature TH1 may be formed to be higher than the value of a second low-temperature heating temperature TH2. In this case, the difference between the first high-temperature-heating temperature TH1 and the second high-temperature-heating temperature TH2 may be formed to be less than the difference between the second high-temperature-heating temperature TH2 and the low-temperature-heating temperature TL.

The relation between the high-temperature-heating sections t1-t2 and t3-t4 and the low-temperature-heating-sections 0-t1, t2-t3, and t4-t5 and amounts of discharged treatment liquids are the same as those illustrated in FIGS. 6 and 7. Accordingly, the redundant details thereof will be omitted in the following description.

Figure 9:
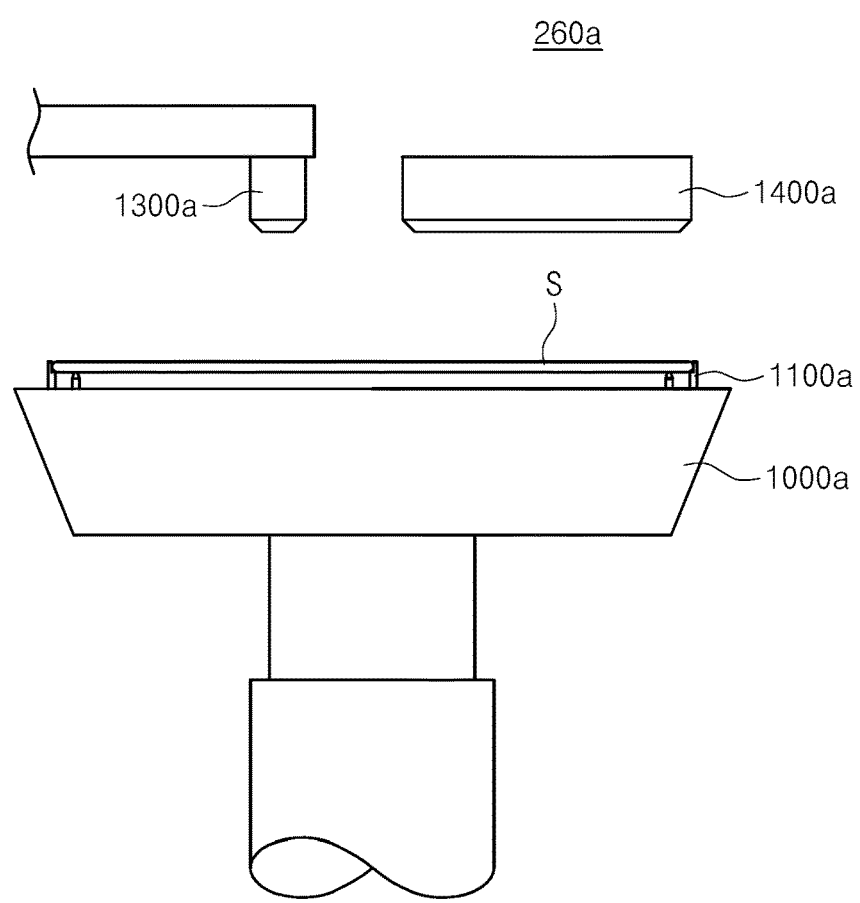
FIG. 9 is a view illustrating a process chamber, according to another embodiment.

FIG. 9 is a view illustrating a process chamber, according to another embodiment.

Referring to FIG. 9, a process chamber 260a includes a support member 1000a, a treatment liquid nozzle 1300a, and a heating member 1400a.

The heating member 1400a may be provided in the form of a laser source which is spaced apart from the support member 1000a by a set distance to irradiate a laser to a substrate positioned on the support member 1000a.

Figure 10:
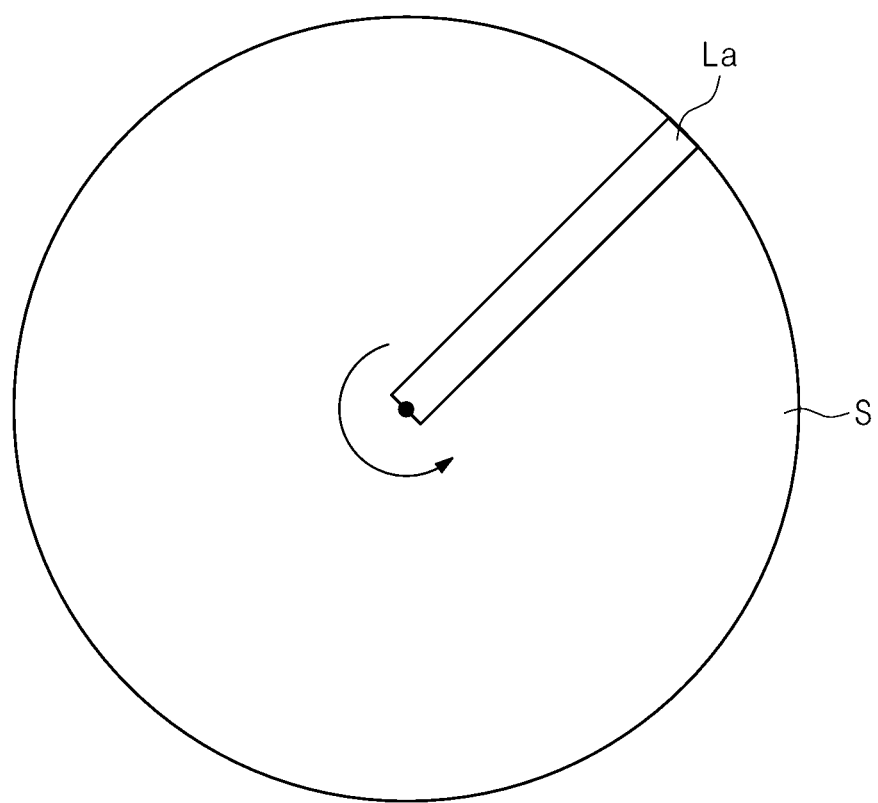
FIG. 10 is a view illustrating a laser irradiated to a substrate, according to an embodiment.

FIG. 10 is a view illustrating a laser irradiated onto the substrate, according to an embodiment.

Referring to FIG. 10, the heating member 1400a may irradiate a laser La in the form of a line beam having a set length. The laser La may be irradiated throughout a region between the rotation center of the substrate S and an outer end portion of the substrate S. Accordingly, when the substrate S is rotated, the laser La may be irradiated throughout the whole top surface of the substrate S.

In addition, the heating member 1400a may be provided such that the laser having the set area is irradiated while moving between the rotation center of the substrate S and the outer end portion of the substrate S.

The relation between the manner that the heating member 1400a heats the substrates S as time elapses and amounts of supplied treatment liquids are the same as those illustrated in FIGS. 4 to 8. Accordingly, the redundant details thereof will be omitted in the following description.

Figure 11:
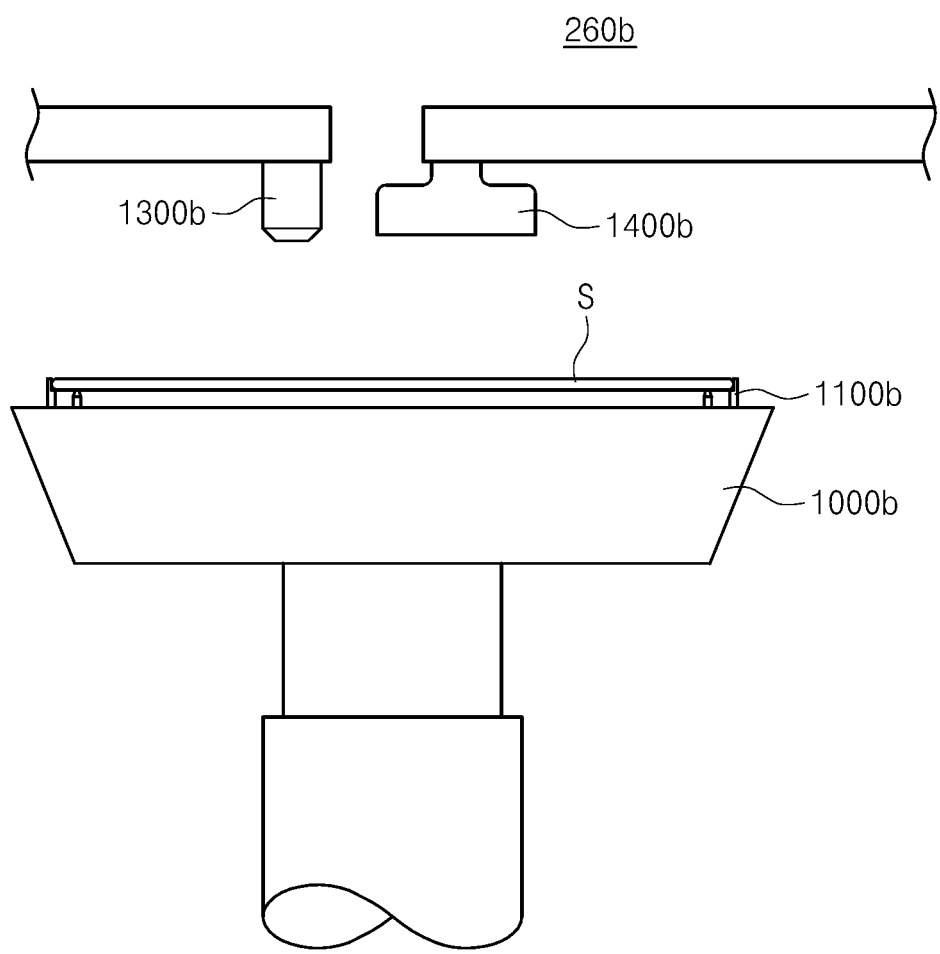
FIG. 11 is a view illustrating a process chamber, according to still another embodiment.

FIG. 11 is a view illustrating a process chamber, according to another embodiment.

Referring to FIG. 11, a process chamber 260b includes a support member 1000b, a treatment liquid nozzle 1300b, and a heating member 1400b The heating member 1400b may be spaced upward from the support member 1000b by a set distance and provided in the form of radiatively heating the substrate S positioned on the support member 1000b. For example, the heating member 1400b may be provided in the form of heating the substrate S using heat emitted from a lamp and a resistor array.

The relation between the manner that the heating member 1400a heats the substrates S as time elapses and amounts of treatment liquids supplied by the treatment liquid nozzle 1300b are the same as those illustrated in FIGS. 4 to 8. Accordingly, the redundant details thereof will be omitted in the following description.

According to an embodiment of the inventive concept, a substrate treating apparatus and a substrate treating method may efficiently treat a substrate.

The above description has been made for the illustrative purpose. Furthermore, the above-mentioned contents describe the exemplary embodiment of the inventive concept, and the inventive concept may be used in various other combinations, changes, and environments. That is, the inventive concept can be modified and corrected without departing from the scope of the inventive concept that is disclosed in the specification, the equivalent scope to the written disclosures, and/or the technical or knowledge range of those skilled in the art. The written embodiment describes the best state for implementing the technical spirit of the inventive concept, and various changes required in the detailed application fields and purposes of the inventive concept can be made. The written embodiment describes the best state for implementing the technical spirit of the inventive concept, and various changes required in the detailed application fields and purposes of the inventive concept can be made. Furthermore, it should be construed that the attached claims include other embodiments.

While the inventive concept has been described with reference to exemplary embodiments thereof, it will be apparent to those of ordinary skill in the art that various changes and modifications may be made thereto without departing from the spirit and scope of the inventive concept as set forth in the following claims.

What is claimed is:

1. A substrate treating apparatus comprising:
   a substrate support to support a substrate;
   a treatment liquid nozzle to supply a treatment liquid to the substrate supported by the substrate support;
   a substrate heater to heat the substrate supported by the substrate support; and
   a controller configured to control the substrate heater to change a heating temperature for the substrate while treating the substrate,
   wherein the controller is configured to control the substrate heater to repeatedly perform higher-temperature heating processes and lower-temperature heating processes to the substrate supported by the substrate support, each of the higher-temperature heating processes being performed in a time slot between sequential time slots of the lower-temperature heating processes.

2. The substrate treating apparatus of claim 1, wherein the controller is configured to control the substrate heater such that a temperature in the lower-temperature heating processes is 1/2 lower than a temperature in the higher-temperature heating processes.

3. The substrate treating apparatus of claim 1, wherein the controller is configured to control the substrate heater to perform the higher-temperature heating processes after the lower-temperature heating processes.

4. The substrate treating apparatus of claim 1, wherein the controller is configured to control the substrate heater such that, when at least two sections in which the higher-temperature heating processes are performed appear, the at least two sections in which the higher-temperature heating processes are performed have equal durations.

5. The substrate treating apparatus of claim 1, wherein the controller is configured to control the substrate heater such that, when at least two sections in which the higher-temperature heating processes are performed appear, the at least two sections in which the higher-temperature heating processes are performed have durations different from each other.

6. The substrate treating apparatus of claim 1, wherein the controller is configured to control the substrate heater such that, when at least two sections in which the lower-temperature heating processes are performed appear, the at least two sections in which the lower-temperature processes are performed have equal durations.

7. The substrate treating apparatus of claim 1, wherein the controller is configured to control the substrate heater such that, when at least two sections in which the lower-temperature heating processes are performed appear, the at least two sections in which the lower-temperature heating processes are performed have durations different from each other.

8. The substrate treating apparatus of claim 1, wherein the controller is configured to control the substrate heater such that a section in which the higher-temperature heating processes are performed has a duration equal to a duration of a section in which the lower-temperature heating processes are performed.

9. The substrate treating apparatus of claim 1, wherein the controller is configured to control the substrate heater such that the temperature in the lower-temperature heating processes includes a first temperature in the lower-temperature heating temperature processes, and a second temperature, which is lower than the first temperature in the lower-temperature heating processes, in the lower-temperature heating processes.

10. The substrate treating apparatus of claim 9, wherein the controller is configured to control the substrate heater such that a difference between the first and second temperatures in the lower-temperature heating processes is formed to be less than a difference between the first temperature in the lower-temperature heating processes and the temperature in the higher-temperature heating processes.

11. The substrate treating apparatus of claim 1, wherein the controller is configured to control the substrate heater such that the temperature in the higher-temperature heating processes includes a first temperature in the higher-temperature heating processes, and a second temperature, which is lower than the first temperature in the higher-temperature heating processes, in the higher-temperature heating processes.

12. The substrate treating apparatus of claim 11, wherein the controller is configured to control the substrate heater such that a difference between the first and second temperatures in the higher-temperature heating processes is formed to be less than a difference between the second temperature in the higher-temperature heating processes and the temperature in the lower-temperature heating processes.

13. The substrate treating apparatus of claim 1, wherein the controller further is configured to control the substrate support, and
   wherein the controller is configured to control the substrate heater and the substrate support such that a rotation speed of the substrate supported by the substrate support is slower in a section in which the higher-temperature heating processes is performed rather than a section in which the lower-temperature heating processes is performed.

14. A substrate treating apparatus comprising:
   a substrate support to support and rotate a substrate;
   a treatment liquid nozzle to supply chemicals, which include at least one of phosphoric acid, sulfuric acid, nitric acid, or ammonia, to the substrate supported by the substrate support;
   a lamp provided inside the substrate support to irradiate light to heat the substrate, which is supported by the substrate support; and a controller configured to control the lamp, the substrate support, and the treatment liquid nozzle such that higher-temperature heating processes and lower-temperature heating processes are repeatedly performed with respect to the substrate supported by the substrate support while the treatment liquid nozzle supplies the chemicals, each of the higher-temperature heating processes being performed in a time slot between sequential time slots of the lower-temperature heating processes.

15. The substrate treating apparatus of claim 14, wherein the substrate support includes:
a chuck stage having a receiving space formed inside the chuck stage; and
a transmissive plate to shield an upper portion of the receiving space and transmit the light, and
wherein the controller is configured to control the lamp, the substrate support, and the treatment liquid nozzle, such that a temperature in the lower-temperature heating processes is 1/2 lower than a temperature in the higher-temperature heating processes, and a rotation speed of the substrate supported by the substrate support is slower in a section in which the higher-temperature heating processes is performed rather than a section in which the lower-temperature heating processes is performed.

* * * * *